United States Patent
Hyun

(10) Patent No.: US 7,972,967 B1
(45) Date of Patent: Jul. 5, 2011

(54) METHOD OF FORMING PATTERNS OF A SEMICONDUCTOR DEVICE INCLUDING FORMING SPACERS ON SIDEWALLS OF AUXILIARY PATTERNS AND REMOVING EXPOSED AUXILIARY PATTERNS

(75) Inventor: Chan Sun Hyun, Icheon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/914,985

(22) Filed: Oct. 28, 2010

(30) Foreign Application Priority Data

Jul. 9, 2010 (KR) .................. 10-2010-0066496

(51) Int. Cl.
*H01L 21/302* (2006.01)
*H01L 21/461* (2006.01)

(52) U.S. Cl. .................. 438/703; 438/743; 438/756

(58) Field of Classification Search .................. 438/703, 438/743, 756; 257/E21.219
See application file for complete search history.

(56) References Cited

U.S. PATENT DOCUMENTS

| 7,727,889 B2 * | 6/2010 | Choi et al. .................. 438/669 |
| 2009/0035584 A1 * | 2/2009 | Tran et al. .................. 428/446 |

FOREIGN PATENT DOCUMENTS

| KR | 100874433 | 12/2008 |
| KR | 1020090072920 | 7/2009 |

* cited by examiner

*Primary Examiner* — William M. Brewster
(74) *Attorney, Agent, or Firm* — Marshall, Gerstein & Borun LLP

(57) ABSTRACT

A method of forming patterns of a semiconductor device comprising forming an auxiliary layer over an underlying layer comprising a cell region and a select transistor region, forming a first passivation layer over the auxiliary layer, wherein the first passivation layer blocks the auxiliary layer of the select transistor region and opens the auxiliary layer of the cell region, and forming a first photoresist pattern having a narrower width than the first passivation layer over (a) the first passivation layer and (b) second photoresist patterns, each having a narrower width than the first photoresist pattern, over an opening region of the auxiliary layer, wherein a gap between the first and second photoresist patterns is identical in width with a gap defined between the second photoresist patterns.

21 Claims, 9 Drawing Sheets

METHOD OF FORMING PATTERNS OF A SEMICONDUCTOR DEVICE INCLUDING FORMING SPACERS ON SIDEWALLS OF AUXILIARY PATTERNS AND REMOVING EXPOSED AUXILIARY PATTERNS

CROSS-REFERENCE TO RELATED APPLICATION

Priority to Korean patent application number 10-2010-0066496 filed Jul. 9, 2010, the entire disclosure of which is incorporated by reference herein, is claimed.

BACKGROUND

An exemplary embodiment relates to a method of forming patterns of a semiconductor device and, more particularly, to a method of forming the patterns of a semiconductor device to improve the uniformity of a gap between patterns with different widths when forming the patterns in the same layer.

Patterns of a semiconductor device can have a variety of sizes. A NAND flash memory device is described as an example. A plurality of strings is formed in a memory cell array region of the NAND flash memory device. Each of the strings includes a source select transistor, a drain select transistor, and a plurality of memory cells coupled in series between the source select transistor and the drain select transistor. The gate of the source select transistor is coupled to the source select line, the gate of the drain select transistor is coupled to the drain select line, and the gates of the memory cells are coupled to word lines. Furthermore, each of the drain select line and the source select line can be wider than the word line. In particular, the word line can have a fine line width that is narrower than the exposure resolution limit, due to the degree of integration of such devices.

As described above, in order to form patterns each having a fine line width narrower than the exposure resolution limit, "Spacer Patterning Technology" (SPT) using spacers has been proposed. The SPT method includes processes of forming first auxiliary patterns for providing prominence and depression shapes so that spacers can be formed, depositing a spacer layer on the surface of the entire structure including the first auxiliary patterns, forming the spacers on the sidewalls of the first auxiliary pattern by etching the spacer layer using an etch method, such as etch-back, so that the spacer layer remains on the sidewalls of the first auxiliary patterns, removing the first auxiliary patterns, and etching an underlying layer using the remaining spacers as an etch mask. In accordance with the SPT method using spacers, patterns having a fine line width can be formed by controlling the thickness of the spacer layer. However, to form patterns each having a line width wider than that of the spacer, a process of forming second auxiliary patterns each having a line width wider than that of the spacer must be further performed after forming the first auxiliary patterns. The second auxiliary patterns, together with the spacer, function as an etch mask in a process of etching the underlying layer, and they are used to form patterns each having a line width wider than the spacer.

FIG. 1 is a diagram showing an alignment relationship between spacers and auxiliary patterns used to form patterns with different line widths.

Referring to FIG. 1, as described above, spacers 53, each defining the width of each of fine patterns narrower than the exposure resolution limit, are formed on sidewalls of first auxiliary patterns 51. A gap D1 between the spacers 53 is defined by the first auxiliary patterns 51. A second auxiliary pattern 55 is formed over a region in which patterns, each having a width wider than a width defined by the spacer 53, will be formed. Here, a gap D2 between a pattern defined by the second auxiliary pattern 55 and the pattern defined by the spacer 53 is determined according to the alignment of the second auxiliary patterns 55. In general, the gap D2 between the finer pattern and the pattern that is wider than the exposure resolution is wider than the gap D1 between the fine patterns defined by the spacers because of the alignment margin of the second auxiliary patterns 55. In this case, in an etch process of forming the patterns of a semiconductor device with different widths, a loading effect in which there is a difference in the degree of etching according to a difference in the density of patterns occurs, which can lead to damage to some regions of the semiconductor device. Problems occurring because of the loading effect are described in more detail below with reference to FIG. 2.

FIG. 2 is a cross-sectional view showing part of a NAND flash memory device formed using a conventional method of forming patterns of a semiconductor device.

Referring to FIG. 2, a gate pattern, including word lines WL and a select line DSL/SSL, is patterned using hard mask patterns 21 as an etch mask. The select line DSL/SSL can include a drain select line DSL or a source select line SSL.

A hard mask pattern 21 for patterning the word line WL can have a line width defined by the above-described spacer and have a line width finer than the exposure resolution. Further, a hard mask pattern 21 for patterning the select line DSL/SSL can have its line width defined by the second auxiliary pattern and have a wider line width than that of the hard mask pattern 21 for patterning the word lines WL. However, a second gap D2 between the select line DSL/SSL and a neighboring word line WL can be wider than a first gap D1 between neighboring word lines WL according to the alignment of the second auxiliary patterns. Thus, in the etch process of forming the gate pattern, layers exposed between the select line DSL/SSL and the neighboring word line WL can be etched faster than layers exposed between the word lines WL, because of a loading effect.

In general, the patterning process of forming the gate pattern is performed after stacking an isolation layer (not shown), a dielectric layer 17, and a second conductive layer 19 over the first conductive layer 15, separated from each other with the isolation layer interposed therebetween, and forming the hard mask pattern 21 over the second conductive layer 19. Before forming the dielectric layer 17, the first conductive layer 15 formed on a gate insulating layer 13 over a semiconductor substrate 11 can be separated with the isolation region interposed therebetween. The above process can be performed by stacking the gate insulating layer 13 and the first conductive layer 15 over the semiconductor substrate 11, forming an isolation mask pattern on the first conductive layer 15, forming trenches (not shown) by etching the first conductive layer 15, the gate insulating layer 13, and the isolation regions of the semiconductor substrate 11 using the isolation mask pattern as an etch mask, and then filling the trenches with the isolation layer. The height of the isolation layer preferably is lower than a top surface of the first conductive layer 15 to increase the area in which the first conductive layer 15 and the second conductive layer 19 face each other and increase the coupling ratio of the gate patterns and preferably higher than a top surface of the gate insulating layer 13 to protect the gate insulating layer 13. Consequently, the dielectric layer 17 is formed on not only the top surfaces of the isolation layer and the first conductive layer 15, but also on the exposed sidewalls of the first conductive layer 15 because of a difference in the height between the first conductive layer 15 and the isolation layer. The thickness of the dielectric layer 17 preferably is controlled so that it does not fill the space between the first conductive layers 15. Meanwhile, in the region in which the select line DSL/SSL will be formed, a contact hole through which the first conductive layer 15 is exposed is formed in the dielectric layer 17. The second conductive layer 19 is formed over the dielectric layer 17 having the contact hole formed therein.

The first conductive layer 15, the dielectric layer 17, and the second conductive layer 19 formed by the above process are etched by an etch process using the hard mask pattern 21 as an etch mask. Here, the second conductive layer 19, the dielectric layer 17, and the first conductive layer 15 are removed in the portion not blocked by the hard mask pattern 21. The second conductive layer 19, the dielectric layer 17, and the first conductive layer 15 can be etched faster in the portion opened in the second width D2, having a relatively wide width with respect to the first width D1, than in the portion opened in the first width D1. Consequently, the gate insulating layer 13 that must remain intact under the second conductive layer 19 can be damaged. To prevent such damage to the gate insulating layer 13, if the thickness of an etch target is reduced when etching the dielectric layer 17, the dielectric layer 17 can remain on the sidewalls of the first conductive layer 15, which can cause a bridge between neighboring strings and the loss of charges. Furthermore, the isolation layer is irregularly lost because of a loading effect, leading to cycling deterioration.

BRIEF SUMMARY

An exemplary embodiment relates to a method of forming the patterns of a semiconductor device, which is capable of improving the uniformity of a gap between patterns having different widths when forming the patterns in the same layer.

A method of forming the patterns of a semiconductor device according to an aspect of the present disclosure comprises forming an auxiliary layer over an underlying layer comprising a cell region and a select transistor region, forming a first passivation layer over the auxiliary layer, where in the first passivation layer blocks the auxiliary layer of the select transistor region and opens the auxiliary layer of the cell region, and forming (a) a first photoresist pattern having a narrower width than the first passivation layer over the first passivation layer and (b) second photoresist patterns, each second photoresist pattern having a narrower width than the first photoresist pattern, over an opening region of the auxiliary layer, to define a gap between the first and second photoresist patterns and a gap between the second photoresist patterns, wherein the gap between the first and second photoresist patterns is identical in width with the gap defined between the second photoresist patterns.

The method preferably further comprises, after forming the first and second photoresist patterns, removing an exposed region of the first passivation layer, removing exposed regions of the auxiliary layer to form auxiliary patterns, removing the first and second photoresist patterns to expose the first passivation layer and the auxiliary patterns that do not overlap with the first passivation layer, forming spacers on sidewalls of the auxiliary patterns, and removing the exposed auxiliary patterns.

The method preferably further comprises forming a hard mask layer over the underlying layer before forming the auxiliary layer, forming hard mask patterns by removing an exposed region of the hard mask layer using the spacers and the auxiliary patterns remaining under the first passivation layer as an etch mask, and forming target patterns by etching an exposed region of the underlying layer using the hard mask pattern as an etch mask after removing the exposed auxiliary patterns.

The first passivation layer preferably is formed over the auxiliary layer of the select transistor region by removing the first passivation layer over the cell region after forming the first passivation layer over the entire surface of the auxiliary layer. The first passivation layer over the cell region preferably is removed by forming a photoresist pattern on the first passivation layer over the select transistor region, etching an exposed region of the first passivation layer to a desired thickness, removing the photoresist pattern, and then etching the first passivation layer using a blanket etch process until the auxiliary layer is exposed.

The method preferably further comprises forming a second passivation layer over the auxiliary layer before forming the first and second photoresist patterns.

The target patterns preferably comprise a first target pattern having a width defined by the sum of a width of the auxiliary pattern under the first passivation layer and a width of the spacer formed on the sidewall of the auxiliary pattern, and second target patterns, each having a width defined by the width of the spacer.

The first target pattern preferably includes a drain select line or a source select line of a NAND flash memory device. The second target patterns preferably include the word lines of the NAND flash memory device.

A method of forming the patterns of a semiconductor device according to another aspect of the present disclosure comprises stacking a hard mask layer and an auxiliary layer over an underlying layer, forming a passivation pattern covering only a portion of the auxiliary layer, forming etch mask patterns over portions of the passivation pattern and the auxiliary layer not covered by the passivation pattern, removing exposed regions of the passivation pattern and the auxiliary layer not covered by the etch mask patterns, removing the etch mask patterns to expose the passivation pattern and the auxiliary layer not covered by the passivation pattern, forming spacers on sidewalls of the remaining auxiliary layer, removing an exposed portion of the auxiliary layer not covered by the passivation pattern, forming hard mask patterns by removing an exposed region of the hard mask layer using the spacers and the remaining auxiliary layer overlapped with the passivation pattern as an etch mask; and forming a plurality of target patterns by etching an exposed region of the underlying layer using the hard mask patterns as an etch mask.

The passivation pattern preferably is formed by forming a first passivation layer over the auxiliary layer, forming a photoresist pattern over the first passivation layer, lowering a height of the first passivation layer in an exposed region of the first passivation layer by etching the exposed region of the first passivation layer using the photoresist pattern as an etch mask, removing the photoresist pattern, and then etching the first passivation layer using a blanket etch process until the auxiliary layer is exposed.

The etch mask pattern preferably comprises a first photoresist pattern formed over the passivation pattern and having a narrower width than the width of the passivation pattern, and second photoresist patterns not overlapped with the passivation pattern, formed over the auxiliary layer, and each configured to have a narrower width than the width of the first photoresist pattern.

The method preferably further comprises forming a second passivation layer over the auxiliary layer, including the passivation pattern, before forming the etch mask pattern.

Before removing exposed regions of the passivation pattern and the auxiliary layer that do not overlap with the etch mask pattern, the second passivation layer exposed between the etch mask patterns preferably is removed. The remaining second passivation layer preferably is removed after removing the etch mask pattern.

In the above embodiments, the auxiliary layer preferably comprises a Spin-On Carbon (SOC) layer.

In the above embodiments, the first passivation layer preferably is deposited at a temperature in a range of 40° C. to 90° C. Further, the first passivation layer preferably comprises a Spin-On Carbon (SOC) layer, an amorphous carbon layer, or an oxide layer.

In the above embodiments, the second passivation layer preferably comprises SiC, polysilicon, or SiON.

DESCRIPTION OF EMBODIMENT

Figure 1:
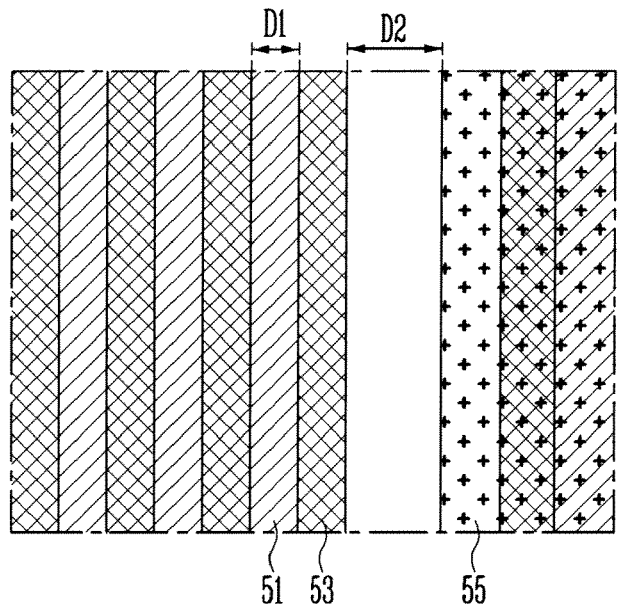
FIG. 1 is a diagram showing an alignment relationship between spacers and auxiliary patterns used to form patterns with different line widths.
Figure 2:
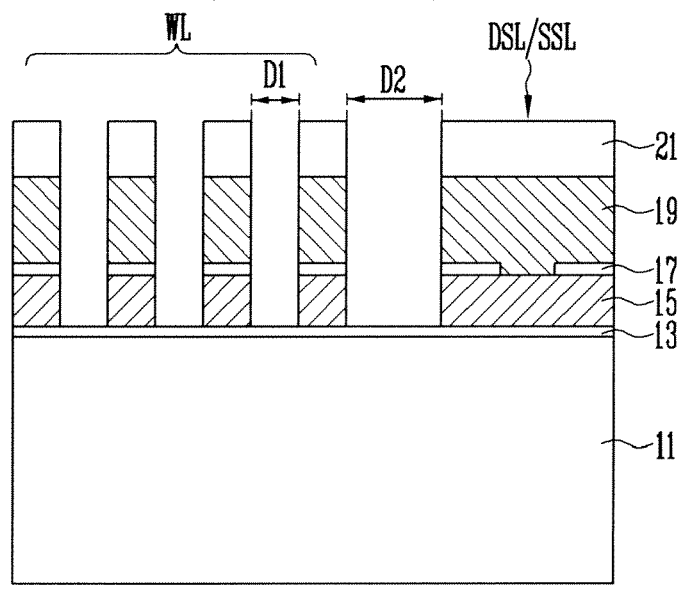
FIG. 2 is a cross-sectional view showing part of a NAND flash memory device formed using a conventional method of forming patterns of a semiconductor device.

Hereinafter, an exemplary embodiment of the present disclosure is described in detail with reference to the accompanying drawings. The drawing figures are provided to allow those having ordinary skill in the art to understand the scope of the embodiment of the disclosure.

FIGS. 3A to 3I are cross-sectional views illustrating a method of forming the patterns of a semiconductor device according to an exemplary embodiment of this disclosure.

Figure 3A:
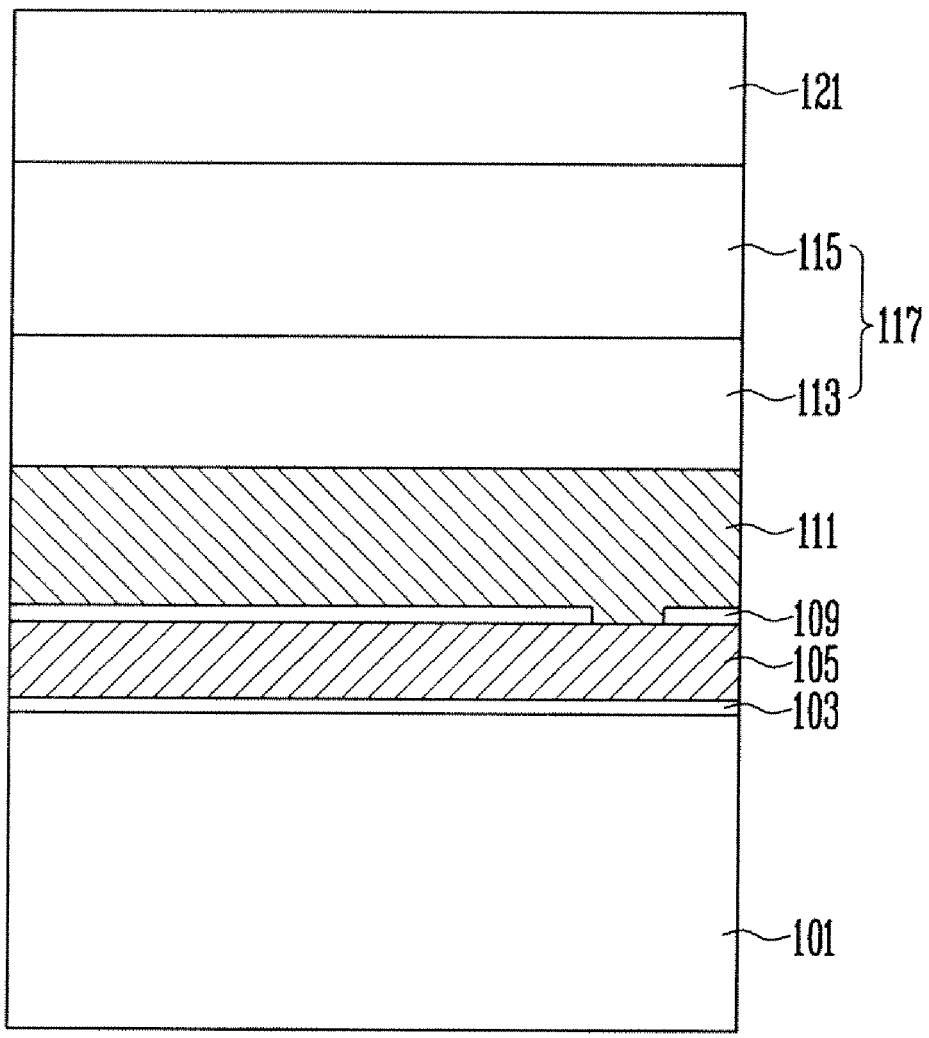
FIGS. 3A to 3I are cross-sectional views illustrating a method of forming the patterns of a semiconductor device according to an exemplary embodiment of this disclosure.

Referring to FIG. 3A, a hard mask layer 117 and an auxiliary layer 121 are stacked over an underlying layer for forming patterns.

The underlying layer can be a semiconductor substrate 101 in itself or can be a layer including at least one of a conductive layer and an insulating layer formed over the semiconductor substrate 101. Where this disclosure is used to form gate patterns of a NAND flash memory device, the underlying layer can be a gate insulating layer 103, a first conductive layer 105, a dielectric layer 109, and a second conductive layer 111, which are stacked over the semiconductor substrate 101. In this case, a contact hole through which the first conductive layer 105 is exposed is formed in the dielectric layer 109, and the first conductive layer 105 and the second conductive layer 111 thus can be electrically coupled through the contact hole. The contact hole is disposed in a region where a source select line and a drain select line will be formed. The first conductive layer 105 and the second conductive layer 111 preferably are made of polysilicon, and the dielectric layer 109 preferably is formed by stacking an oxide layer, a nitride layer, and an oxide layer.

The hard mask layer 117 serves as an etch mask when subsequently etching the underlying layer. The hard mask layer 117 can be formed of a single layer or a plurality of stack layers according to the etch selectivity for the underlying layer. For example, where a gate pattern is to be formed, the hard mask layer 117 can have a stack structure of an oxide layer 113, being capable of serving as an etch mask when etching the second conductive layer 111 made of polysilicon in a subsequent process, and a polysilicon layer 115 capable of protecting the oxide layer 113 when etching the auxiliary layer 121 in a subsequent process.

The auxiliary layer 121 preferably is made of a material selected with consideration taken of the etch selectivity for a spacer layer formed in a subsequent process. For example, the auxiliary layer 121 can be formed of a Spin-On Carbon (SOC) layer.

Figure 3B:
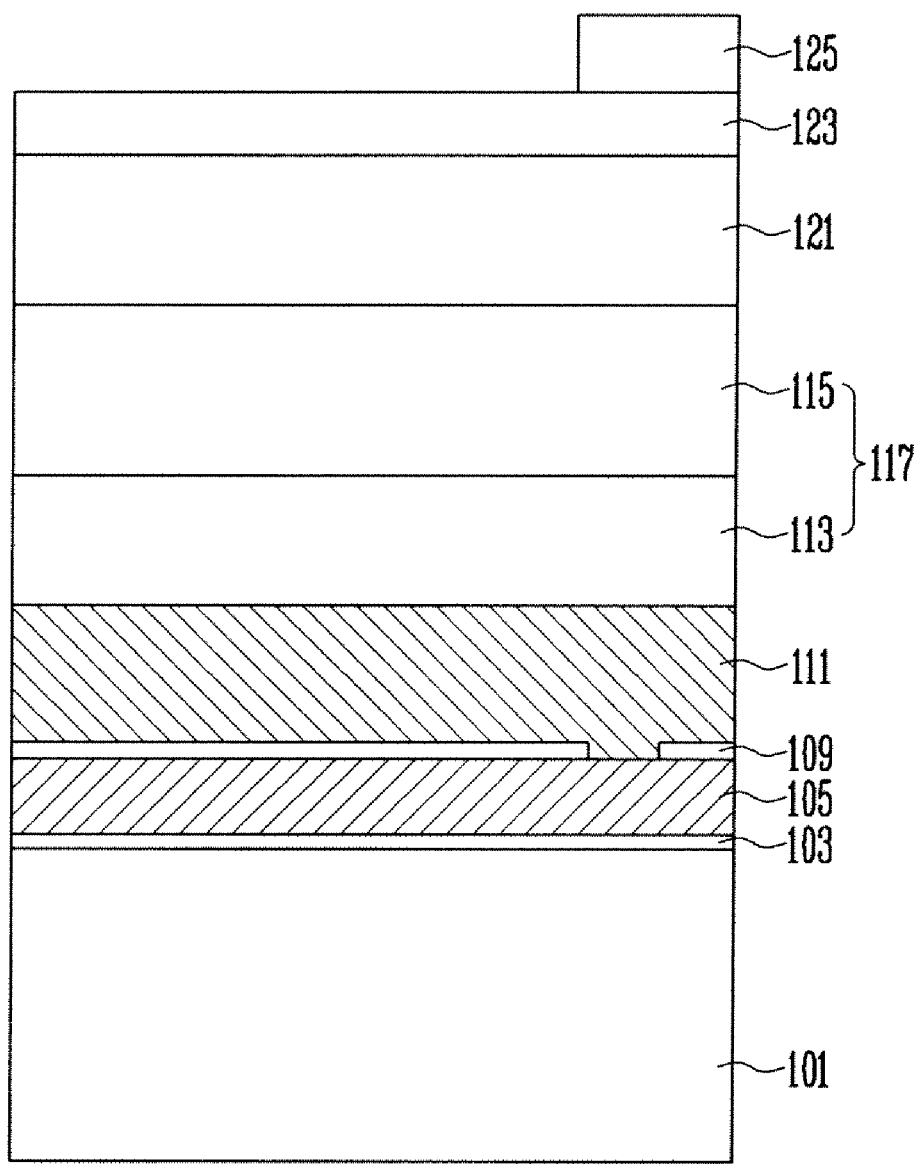

Referring to FIG. 3B, a first passivation layer 123 is formed over the auxiliary layer 121. The first passivation layer 123 preferably is made of a material selected by taking the etch selectivity for the auxiliary layer 121 into consideration. For example, the first passivation layer 123 preferably is formed of a layer deposited at a temperature in a range of 40° C. to 90° C. At 40 to 90° C., an oxide layer such as an Ultra Low Temperature Oxide (ULTO) layer, a Spin On Carbon (SOC) layer, or an Amorphous Carbon Layer (ACL) can be formed. Furthermore, the first passivation layer 123 preferably is formed in thickness of 100 Å to 500 Å.

A photoresist pattern 125 (i.e., an etch mask pattern) is formed over the first passivation layer 123. The photoresist pattern 125 is formed as a pattern for blocking the first passivation layer 123 over a region in which a first target pattern having a relatively wide width (e.g., a select transistor region where a source select line or a drain select line will be formed) and for exposing the first passivation layer 123 over a region in which a second target pattern having a narrower width than the first target pattern will be formed (e.g., a cell region where word lines will be formed).

Figure 3C:
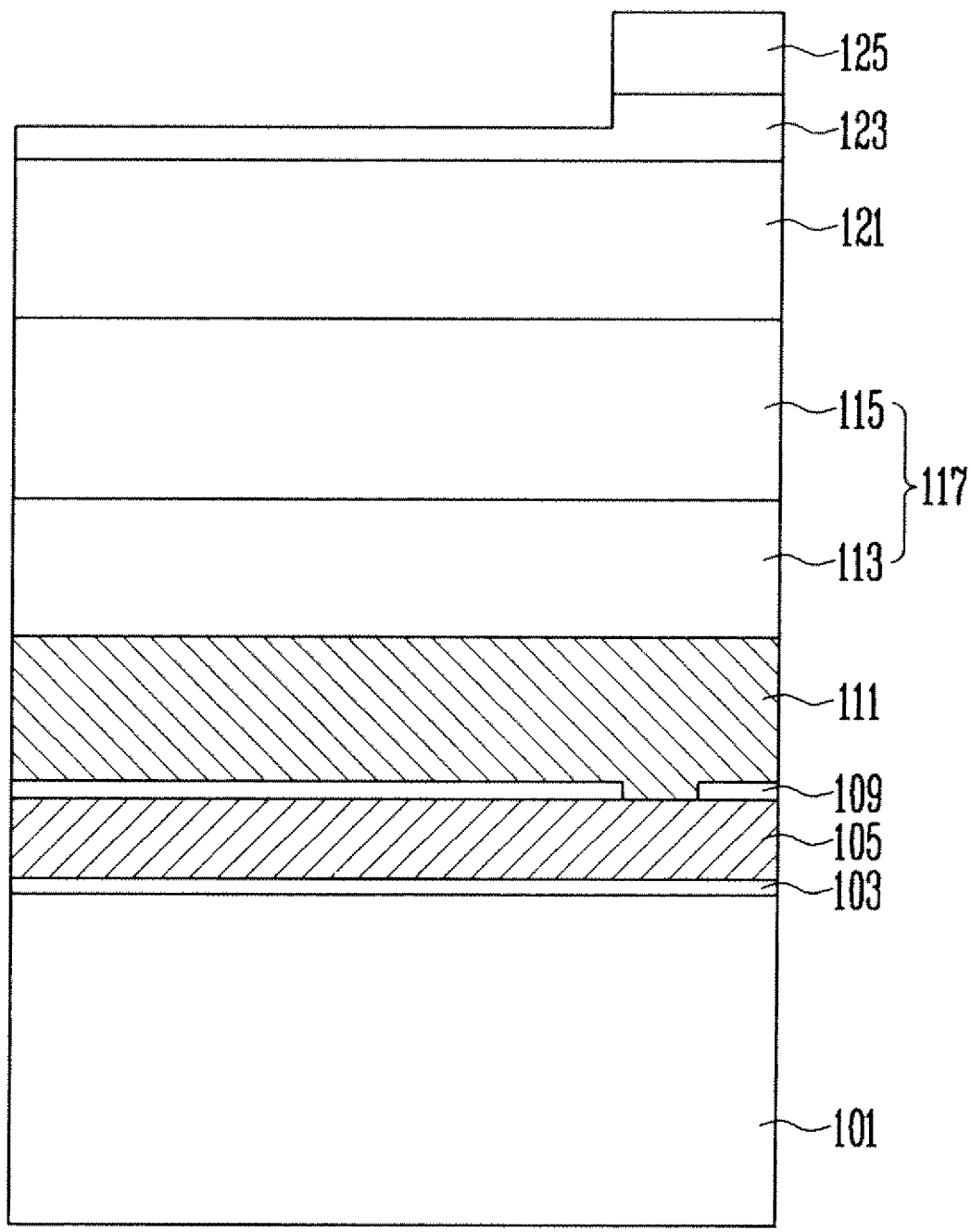

Referring to FIG. 3C, the exposed region of the first passivation layer 123 is etched using the photoresist pattern 125 as an etch mask. Here, to prevent the auxiliary layer 121 from being lost in a subsequent strip process of removing the photoresist pattern 125, the first passivation layer 123 can be etched to a desired thickness so that the auxiliary layer 121 is not exposed. Thus, the first passivation layer 123 becomes thinner in the region not blocked by the photoresist pattern 125 than in the region blocked by the photoresist pattern 125.

Figure 3D:
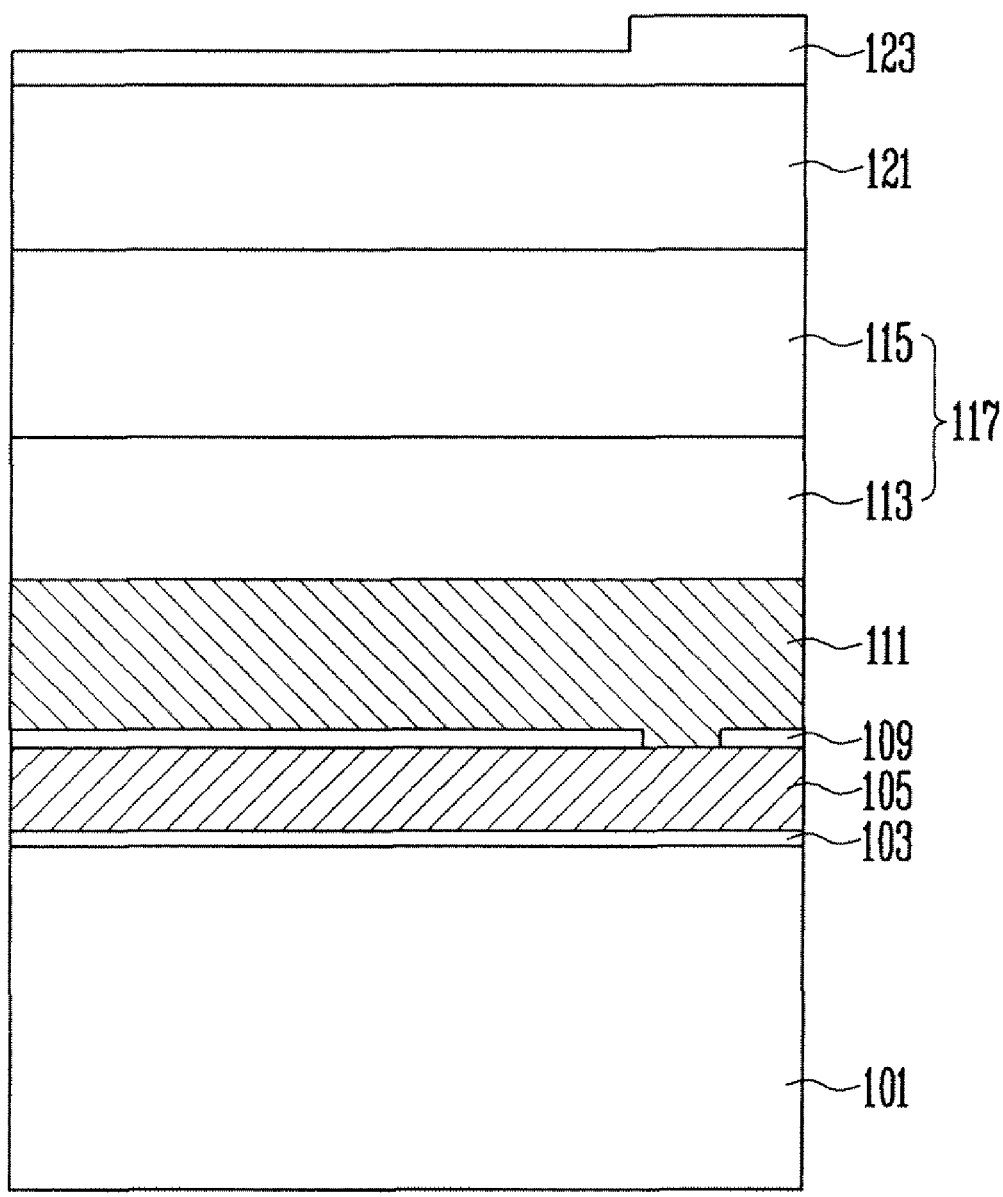

Referring to FIG. 3D, the photoresist pattern 125 is removed, preferably using a strip process. Thus, the first passivation layer 123 over the regions in which the first and second target patterns will be formed is exposed.

Figure 3E:
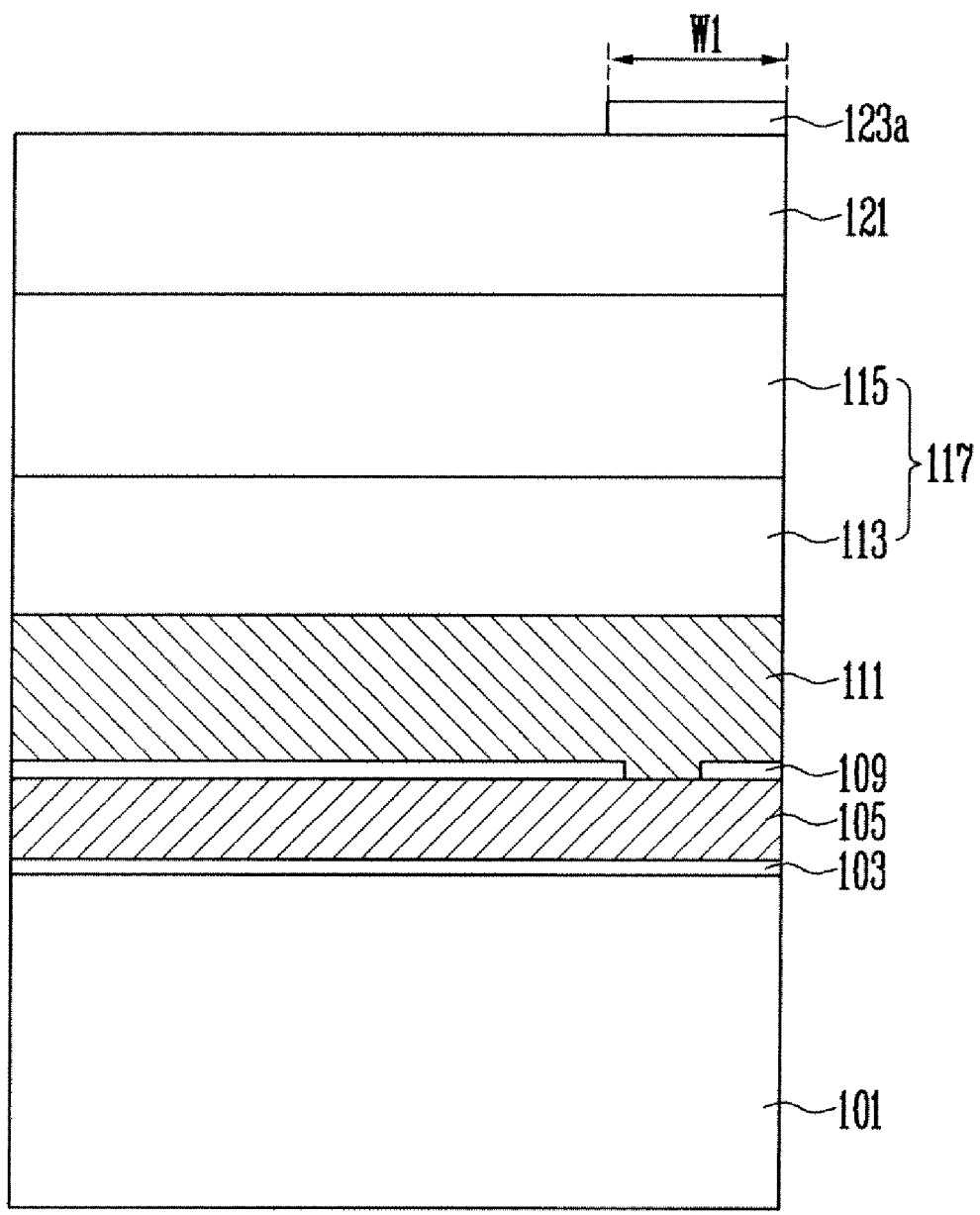

Referring to FIG. 3E, the auxiliary layer 121 over the region in which the second target pattern will be formed is exposed by etching the first passivation layer 123 exposed over the regions in which the first and second target patterns will be formed using an etch process, such as by a blanket etch process. However, the first passivation layer 123 over the region in which the first target pattern will be formed remains intact as a passivation pattern 123a having a first width W1, as shown in FIG. 3E, so that the auxiliary layer 121 over the region where the first target pattern will be formed is blocked.

The first passivation layer 123 can remain as the passivation pattern 123a having the first width W1 over the region in which the first target pattern will be formed, as described above, because the first passivation layer 123 is thicker over the region in which the first target pattern will be formed than over the region in which the second target pattern will be formed. Meanwhile, the first width W1 preferably is wider than the width of a first photoresist pattern which will be formed over the passivation pattern 123a in a subsequent process. This of guarantees the alignment margin when forming the first photoresist pattern in the subsequent process. Further, if the first width W1 is wider than the width of the first photoresist pattern to be formed over the passivation pattern 123a, the auxiliary layer 121 over the region in which the first target pattern will be formed will be fully blocked by the passivation pattern 123a and a spacer to be formed in a subsequent process. Accordingly, when subsequently removing the auxiliary layer 121 exposed over the region in which the second target pattern will be formed, the auxiliary layer 121 over the region in which the first target pattern will be formed can be protected by the passivation pattern 123a and the spacer, and so it can remain intact.

Figure 3F:
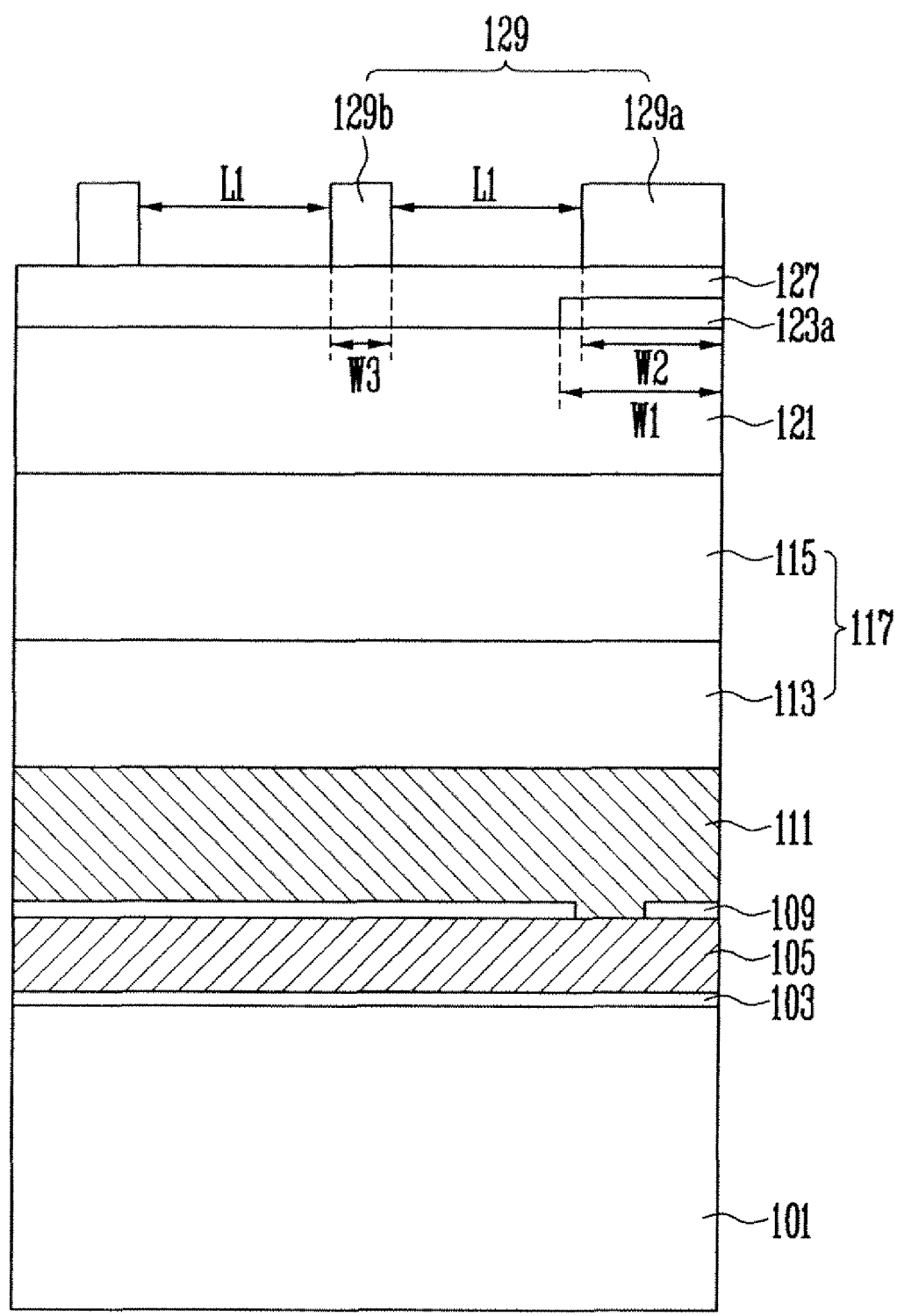

Referring to FIG. 3F, an etch mask pattern 129 is formed over the auxiliary layer 121 including the passivation pattern 123a having the first width W1. Before forming the etch mask pattern 129, a second passivation layer 127 can be formed over the auxiliary layer 121 including the passivation pattern 123a having the first width W1.

The second passivation layer 127 preferably is formed of a Multi-Function Hard Mask (MFHM) layer. The second passivation layer 127 prevents the auxiliary layer 121 from being removed when removing the etch mask pattern 129 (i.e., photoresist materials) such as by using a strip process in a subsequent process. The auxiliary layer 121 preferably comprises carbon-rich SiC, polysilicon, or SiON.

The etch mask pattern 129 includes a first photoresist pattern 129a and a second photoresist pattern 129b. The first photoresist pattern 129a has a second width W2 narrower than the first width W1 of the passivation pattern 123a and overlapping the passivation pattern 123a thereon. The second photoresist pattern 129b has a third width W3 narrower than the second width W2 and overlapping the auxiliary layer 121 not protected by the passivation pattern 123a having the first width W1. To subsequently make identical the width of a gap between the first target pattern and the second target pattern and a gap between neighboring second target patterns, a gap between the first photoresist pattern 129a and the second photoresist pattern 129b, which are adjacent to each other, preferably has a first gap L1, which is identical with a gap between the second photoresist patterns 129b adjacent to each other.

As described above, since the first and second photoresist patterns 129a and 129b with different widths are formed through a single photolithography process, the gap L1 between them can be uniformly formed. Further, since the second width W2 of the first photoresist pattern 129a is narrower than the first width W1 of the passivation pattern 123a, the second width W2 can easily overlap with the first width W1 thereon.

The second passivation layer 127, the passivation pattern 123a having the first width W1, and the auxiliary layer 121, which are exposed between the etch mask patterns 129a and 129b, are removed.

Figure 3G:
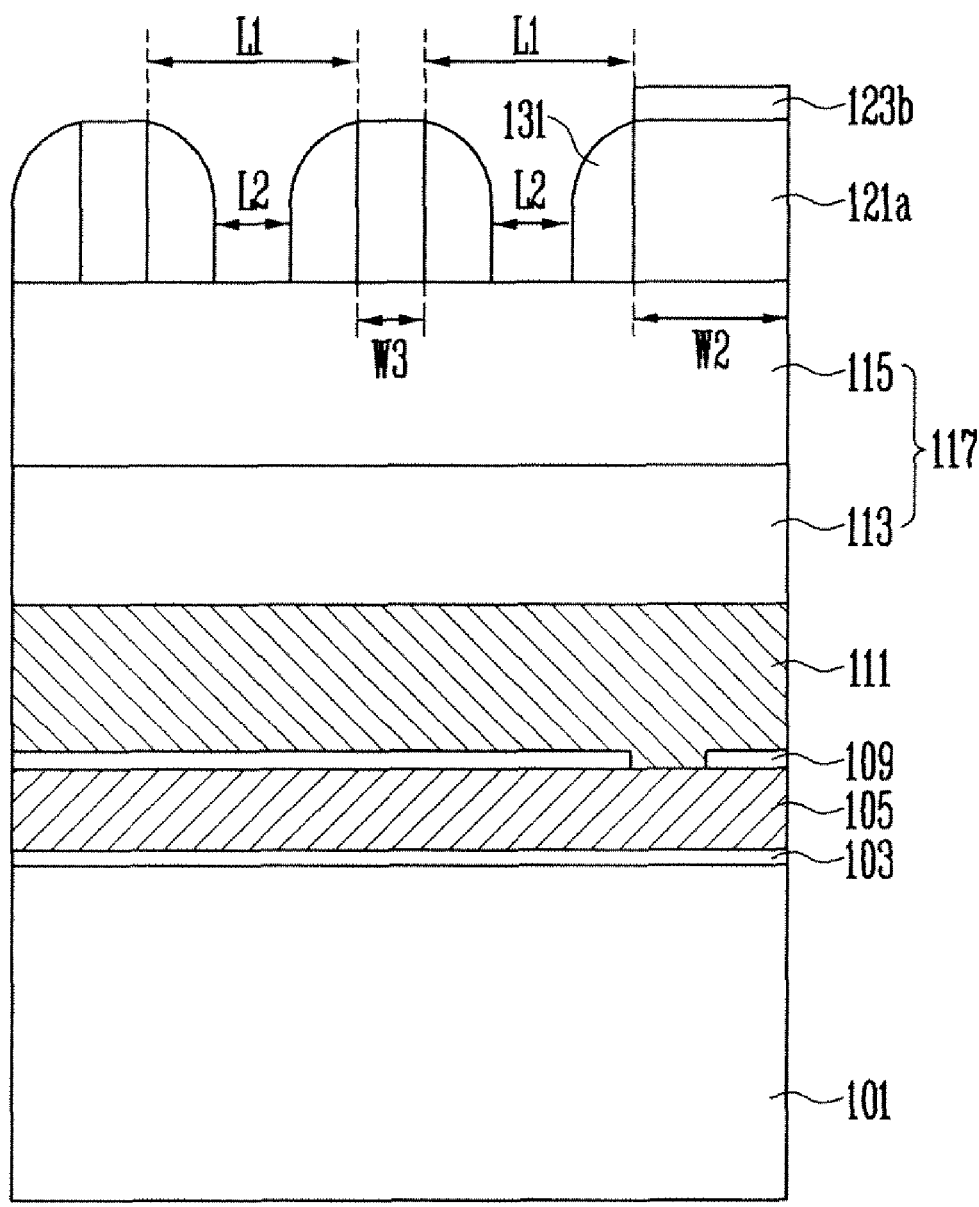

Accordingly, as shown in FIG. 3G, a passivation pattern 123b having the second width W2 and a plurality of auxiliary patterns 121a protected or not protected by the passivation pattern 123b having the second width W2 are formed over the hard mask layer 117. A portion protected by the passivation pattern 123b having the second width W2, from among the auxiliary patterns 121a, has the second width W2, and portions not protected by the passivation pattern 123b having the second width W2 have a third width W3.

In this disclosure, a gap between the passivation pattern 123b having the second width W2 and the auxiliary pattern 121a having the third width W3 and a gap between the neighboring auxiliary patterns 121a each having the third width W3 are defined by etch mask patterns and so they can be formed to have the first gap L1 identically.

After forming the auxiliary patterns 121a and the passivation pattern 123b having the second width W2, the etch mask patterns are removed such as by using a strip process. Next, the remaining second passivation layer 127 can be removed.

Next, spacers 131 are formed on the sidewalls of the auxiliary patterns 121a. The spacers 131 preferably are formed by forming a spacer layer on a surface of the hard mask layer 117, including the auxiliary patterns 121a and the passivation pattern 123b having the second width W2, and then etching the spacer layer using an etch process, such as an etch-back process, to expose the auxiliary patterns 121a and the passivation pattern 123b having the second width W2. Here, the thickness of the spacer layer preferably is controlled so that the spacer layer does not fill the space between the auxiliary patterns 121a. Furthermore, the spacer layer preferably comprises an oxide layer. Meanwhile, the auxiliary pattern 121a under the passivation pattern 123b having the second width W2 is protected by the passivation pattern 123b having the second width W2 and thus is not exposed. Furthermore, the passivation pattern 123b having the second width W2 can be partially removed such as by using an etch-back process for forming a spacer so that it remains, preferably with a thickness of 50 Å to 400 Å.

Furthermore, a second gap L2 between the spacers 131 formed between the auxiliary patterns 121a can become the same as the third width W3 by controlling the thickness of the spacer layer.

Figure 3H:
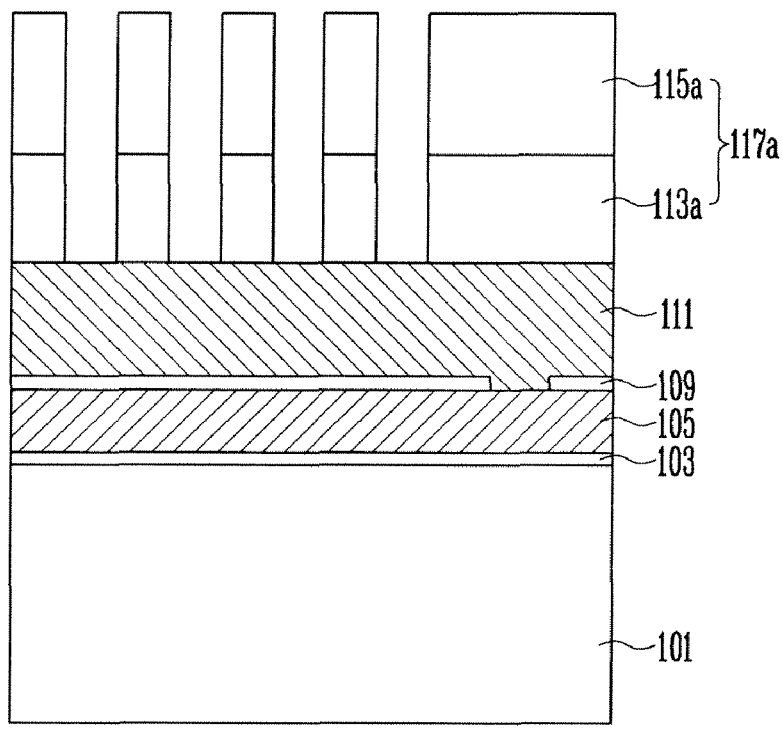

Referring to FIG. 3H, after removing the auxiliary patterns 121a, each having the third width W3, not protected by the passivation pattern having the second width W2, the exposed region of the hard mask layer 117 is removed using the remaining spacers and the remaining auxiliary pattern having the second width W2 under the passivation pattern, having the second width W2, as an etch mask. Accordingly, hard mask patterns 117a with different line widths are formed. Here, since the width of each of the regions opened by removing the auxiliary patterns, each having the third width W3, is identical with the width of the region opened between the spacers, the width of each of the regions not blocked by the hard mask patterns 117a can also be identically formed.

The hard mask pattern 117a preferably has a stack structure of a polysilicon layer pattern 115a, formed by etching a polysilicon layer, and an oxide layer pattern 113a formed by etching an oxide layer not blocked by the polysilicon layer pattern 115a. After forming the hard mask pattern 117a, the remaining spacers, the remaining passivation pattern having the second width, and the remaining auxiliary patterns can be removed.

In the foregoing, the etch process of forming the spacers, the process of removing the auxiliary patterns each having the third width, and the etch process of forming the hard mask pattern 117a preferably are performed in-situ. Accordingly, a process of manufacturing semiconductor devices can be simplified.

Figure 3I:
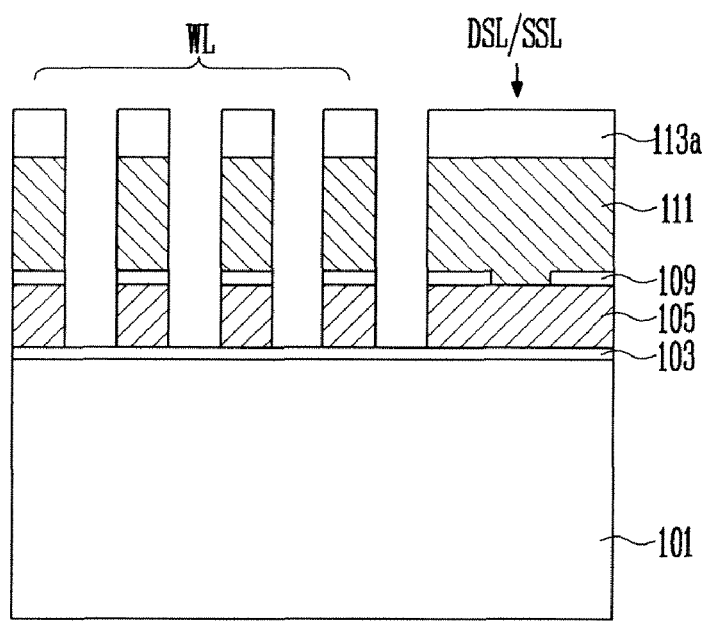

Referring to FIG. 3I, exposed regions of the underlying layer are removed using the hard mask patterns as an etch mask. Accordingly, the first target pattern DSL/SSL and the second target patterns WL each narrower than the first target pattern DSL/SSL are formed at the same time. Here, since the regions not blocked by the hard mask patterns have the same width, a loading effect in which the etch rate is relatively fast in some regions can be improved. Further, a width of the first target pattern DSL/SSL is defined by the sum of the second width and a width of the spacer formed on the sidewall of the passivation pattern having the second width. Furthermore, a width of the second target pattern WL is defined by a width of the spacer.

A case where a gate pattern is formed is described as an example. The underlying layer removed by an etch process using hard mask patterns as an etch mask can include a second conductive layer 111, a dielectric layer 109, and a first conductive layer 105. The first target pattern can include a drain select line DSL or a source select line SSL, and the second target patterns can include word lines WL. In case where this disclosure is applied to a process of forming the gate pattern as described above, a gap between the select line DSL or SSL and an edge word line neighboring the select line DSL or SSL, from among the word lines WL can become the same as a gap between the word lines WL. Furthermore, in accordance with this disclosure, since the regions not blocked by the hard mask patterns have the same width, a problem that the etch rate becomes relatively fast in some regions and the gate insulating layer 103 is damaged and a problem that there is a difference in the degree of loss in an isolation layer can be improved. More particularly, a difference in the thickness between a gate insulating layer 103, remaining between the neighboring word lines WL, and the gate insulating layer 103, remaining between the edge word line WL and the select line DSL or SSL, can be improved within 5 Å. Further, a difference in the thickness between the isolation layer, remaining between the neighboring word lines WL, and the isolation layer, remaining between the edge word line WL and the select line DSL or SSL, can be improved within 10 Å

In the foregoing, the edge word line WL neighboring the select line DSL or SSL is not used as a word line for driving memory cells for storing data, but can be used as a passing word line for improving disturbance.

In case where as described above, this disclosure is applied to form a gate pattern, damage to the gate insulating layer 103 can be prevented. Accordingly, in accordance with this disclosure, since it is not necessary to reduce the thickness becoming an etch target of the dielectric layer 107 to prevent damage to the gate insulating layer 103, a problem that the dielectric layer 107 remains on the sidewalls of the first conductive layer 105 can be improved. Consequently, a phenomenon in which a bridge is generated between neighboring strings because the dielectric layer 107 remains on the sidewalls of the first conductive layer 105 and a phenomenon in which a data retention characteristic deteriorates because of the loss of charges can be improved. Furthermore, in accordance with this disclosure, since an irregular loss of an isolation layer resulting from a loading effect can be improved, the deterioration of a cycling characteristic occurring because the threshold voltage is shifted by the irregular loss of the isolation layer can be improved.

As described above, in accordance with this disclosure, after forming the passivation pattern over the auxiliary layer, the auxiliary layer including the passivation pattern is etched. Thus, the remaining auxiliary layer is classified into a portion, not overlapped with the passivation pattern and having a top surface exposed, and a portion, overlapped with the passivation pattern and having a top surface blocked by the passivation pattern. Accordingly, although the spacers are formed on the sidewalls of the auxiliary layer and the passivation pattern remaining in a subsequent process and the exposed auxiliary layer is then removed, the auxiliary layer overlapped with and protected by the passivation pattern remains intact, thus defining the region where the first target pattern will be formed, having a relatively wide width, along with the spacer formed on the sidewall of the auxiliary layer. Further, the spacers separated from each other with the region, having the auxiliary layer removed therefrom, interposed therebetween define the respective regions in which the second target patterns, each having a narrower width than the first target pattern, will be formed. Consequently, in accordance with this disclosure, the patterns with different widths can be formed in the same layer at the same time using the remaining spacers and the remaining auxiliary layer as an etch mask.

Furthermore, in accordance with this disclosure, the passivation pattern is wider than the photoresist pattern functioning as an etch mask when etching the passivation pattern. Thus, when etching the auxiliary layer including the passivation pattern, the photoresist patterns functioning as an etch mask can be easily aligned on the passivation pattern. Further, the passivation pattern can have a target width by removing the passivation pattern and the auxiliary layer exposed between the photoresist patterns in a subsequent process. In accordance with the above process, the width of each of the regions from which the passivation pattern and the auxiliary layer have been removed is determined by a gap between the photoresist patterns formed through the same photolithography process. Accordingly, the regions from which the passivation pattern and the auxiliary layer have been removed can have the same width. Since the width of the region from which the passivation pattern and the auxiliary layer have been removed defines a gap between the patterns of a semiconductor device to be formed, the patterns of the semiconductor device can be formed to have an uniform gap.

In accordance with this disclosure, since the gap between the patterns of the semiconductor device can be uniformly defined, a loading effect in which the etch rate becomes relatively fast in some regions in an etch process of forming the patterns of the semiconductor device can be improved. Accordingly, problems resulting from the loading effect can be improved.

What is claimed is:

1. A method of forming patterns of a semiconductor device, comprising:
   forming an auxiliary layer over an underlying layer comprising a cell region and a select transistor region;
   forming a first passivation layer over the auxiliary layer, wherein the first passivation layer blocks the auxiliary layer of the select transistor region and opens the auxiliary layer of the cell region;
   forming (a) a first photoresist pattern having a narrower width than the first passivation layer over the first passivation layer and (b) second photoresist patterns, each second photoresist pattern having a narrower width than the first photoresist pattern, over an opening region of the auxiliary layer, to define a gap between the first and second photoresist patterns and a gap between the second photoresist patterns, wherein the gap between the first and second photoresist patterns is identical in width with the gap defined between the second photoresist patterns;
   removing an exposed region of the first passivation layer;
   removing exposed regions of the auxiliary layer to form auxiliary patterns;
   removing the first and second photoresist patterns to expose the first passivation layer and the auxiliary patterns that do not overlap with the first passivation layer;
   forming spacers on sidewalls of the auxiliary patterns; and
   removing the exposed auxiliary patterns.

2. The method of claim 1, further comprising:
   forming a hard mask layer over the underlying layer before forming the auxiliary layer;
   forming hard mask patterns by removing an exposed region of the hard mask layer using the spacers and the auxiliary patterns remaining under the first passivation layer as an etch mask; and
   forming target patterns by etching an exposed region of the underlying layer using the hard pattern as an etch mask after removing the exposed auxiliary patterns.

3. The method of claim 2, wherein the auxiliary layer comprises a Spin-On Carbon (SOC) layer.

4. The method of claim 1, comprising forming the first passivation layer over the auxiliary layer of the select transistor region by removing the first passivation layer over the cell region after forming the first passivation layer over an entire surface of the auxiliary layer.

5. The method of claim 4, comprising removing the first passivation layer over the cell region by forming a photoresist pattern on the first passivation layer over the select transistor region, etching an exposed region of the first passivation layer to a desired thickness, removing the photoresist pattern, and then etching the first passivation layer using a blanket etch process until the auxiliary layer is exposed.

6. The method of claim 1, comprising depositing the first passivation layer at a temperature in a range of 40° C. to 90° C.

7. The method of claim 6, wherein the first passivation layer comprises a Spin-On Carbon (SOC) layer, an amorphous carbon layer, or an oxide layer.

8. The method of claim 1, further comprising forming a second passivation layer over the auxiliary layer before forming the first and second photoresist patterns.

9. The method of claim 8, wherein the second passivation layer comprises SiC, polysilicon, or SiON.

10. The method of claim 2, wherein the target patterns comprise a first target pattern having a width defined by a sum of a width of the auxiliary pattern under the first passivation layer and a width of the spacer formed on a sidewall of the auxiliary pattern, and second target patterns, each having a width defined by the width of the spacer.

11. The method of claim 10, wherein:
the first target pattern includes a drain select line or a source select line of a NAND flash memory device; and
the second target patterns include word lines of the NAND flash memory device.

12. A method of forming patterns of a semiconductor device, comprising:
stacking a hard mask layer and an auxiliary layer over an underlying layer;
forming a passivation pattern covering only a portion of the auxiliary layer;
forming etch mask patterns over portions of the passivation pattern and the auxiliary layer not covered by the passivation pattern;
removing exposed regions of the passivation pattern and the auxiliary layer not covered by the etch mask patterns;
removing the etch mask patterns to expose the passivation pattern and the auxiliary layer not covered by the passivation pattern;
forming spacers on sidewalls of the remaining auxiliary layer;
removing an exposed portion of the auxiliary layer not covered by the passivation pattern;
forming hard mask patterns by removing an exposed region of the hard mask layer using the spacers and the remaining auxiliary layer overlapped with the passivation pattern as an etch mask; and
forming a plurality of target patterns by etching an exposed region of the underlying layer using the hard mask patterns as an etch mask.

13. The method of claim 12, wherein the auxiliary layer comprises a Spin-On Carbon (SOC) layer.

14. The method of claim 12, comprising forming the passivation pattern by:
forming a first passivation layer over the auxiliary layer;
forming a photoresist pattern over the first passivation layer;
lowering a height of the first passivation layer in an exposed region of the first passivation layer by etching the exposed region of the first passivation layer using the photoresist pattern as an etch mask;
removing the photoresist pattern; and
then etching the first passivation layer using a blanket etch process until the auxiliary layer is exposed.

15. The method of claim 14, comprising depositing the first passivation layer at a temperature in a range of 40° C. to 90° C.

16. The method of claim 14, wherein the first passivation layer comprises a Spin-On Carbon (SOC) layer, an amorphous carbon layer, or an oxide layer.

17. The method of claim 12, wherein the etch mask pattern comprises (a) a first photoresist pattern formed over the passivation pattern and having a narrower width than the width of the passivation pattern, and (b) second photoresist patterns not overlapped with the passivation pattern and formed over the auxiliary layer, each second photoresist pattern having a narrower width than the width of the first photoresist pattern.

18. The method of claim 17, wherein a gap defined between the first and second photoresist patterns is identical in width with a gap defined between the second photoresist patterns.

19. The method of claim 12, further comprising forming a second passivation layer over the auxiliary layer, including the passivation pattern, before forming the etch mask pattern.

20. The method of claim 19, comprising:
removing the second passivation layer exposed between the etch mask patterns before removing exposed regions of the passivation pattern and the auxiliary layer that does not overlap with the etch mask pattern; and
removing the remaining second passivation layer after removing the etch mask pattern.

21. The method of claim 20, wherein the second passivation layer comprises SiC, polysilicon, or SiON.

* * * * *